(12) United States Patent
Compen

(10) Patent No.: US 7,050,147 B2
(45) Date of Patent: May 23, 2006

(54) METHOD OF ADJUSTING A HEIGHT OF PROTRUSIONS ON A SUPPORT SURFACE OF A SUPPORT TABLE, A LITHOGRAPHIC PROJECTION APPARATUS, AND A SUPPORT TABLE FOR SUPPORTING AN ARTICLE IN A LITHOGRAPHIC APPARATUS

(75) Inventor: Rene Theodorus Petrus Compen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 55 days.

(21) Appl. No.: 10/886,050

(22) Filed: Jul. 8, 2004

(65) Prior Publication Data

US 2006/0006340 A1 Jan. 12, 2006

(51) Int. Cl.
*H01J 21/27* (2006.01)

(52) U.S. Cl. ............................. 355/30; 355/53; 355/55; 355/67; 250/442.11

(58) Field of Classification Search ................. 355/30, 355/53, 67; 250/442.11
See application file for complete search history.

(56) References Cited

U.S. PATENT DOCUMENTS 6,392,738 B1 * 5/2002 van de Pasch et al. ....... 355/30
2005/0061995 A1 * 3/2005 Vink et al. ............... 250/492.1

FOREIGN PATENT DOCUMENTS

JP 2003-188068 * 4/2003

* cited by examiner

*Primary Examiner*—Kiet T. Nguyen
(74) *Attorney, Agent, or Firm*—Pillsbury Winthrop Shaw Pittman LLP

(57) ABSTRACT

A lithographic projection apparatus is disclosed. The apparatus includes a beam production system configured to provide a beam of radiation, pattern the beam, and project the patterned beam onto a target portion of a substrate, and a support table for supporting an article so that a planar surface of the article lies in a predetermined plane transverse to a propagation direction of the projection beam. The support table has a support surface and an array of protrusions disposed on the support surface that are constructed and arranged to support the article. A position selective material surface melting device is configured to act on individual protrusions when the support table is operable in the apparatus, such that localized areas of an upper surface of the protrusion are melted and subsequently allowed to cool, thereby causing the localized areas to be raised with respect to the upper surface of the protrusion.

27 Claims, 7 Drawing Sheets

METHOD OF ADJUSTING A HEIGHT OF PROTRUSIONS ON A SUPPORT SURFACE OF A SUPPORT TABLE, A LITHOGRAPHIC PROJECTION APPARATUS, AND A SUPPORT TABLE FOR SUPPORTING AN ARTICLE IN A LITHOGRAPHIC APPARATUS

FIELD

The present invention relates to a lithographic apparatus and a device manufacturing method for manufacturing a device.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

European Patent Application No 1093022 and corresponding U.S. Pat. No. 6,392,738 address cleaning of the substrate support table. The substrate support tables used in lithography have a support surface with protrusions that extend substantially perpendicularly from the surface. In operation, the backside of the substrate is supported on the protrusions, at a small distance from the support surface of the substrate table, in a position substantially perpendicular to the direction of propagation of the projection beam. Thus, the tops of the protrusions, rather than the support surface of the wafer table, define an effective support surface for the substrate.

EP1093022 and U.S. Pat. No. 6,392,738 describe that contamination present between the backside of the substrate and the protrusions can produce a deformation of the surface of the substrate with detrimental imaging effects. To solve this problem, these documents disclose a detector for recognizing the presence of contamination. Preferably, the presence of contamination is recognized from unevenness of the surface of a substrate on the substrate support table. A suitable device for sensing the level of the substrate is already available, since it is used to adjust the height and tilt of the substrate during exposure.

The documents also disclose cleaning tools for removing contamination from the protrusions. These cleaning tools include a ceramic cleaning block that can be positioned against the support surface and moved in parallel to it to remove contamination by abrasive cleaning. Another embodiment of the cleaning tool includes a sponge provided with a solvent for removing contamination. A further embodiment includes a laser for removing the contamination by heat treatment.

EP1093022 and U.S. Pat. No. 6,392,738 emphasize that measures should be taken not to damage the protrusions themselves when the contamination is removed. In the embodiment of the cleaning block, for example, the forces exerted by the cleaning block should not be so excessive as to damage the protrusions.

Unevenness of the supporting surface can also be caused by dissimilarity between the height of material that makes up the protrusion itself. This is typically the case when a new substrate support table has been manufactured. Possibly uneven wear may also lead to unevenness. The substrate support table typically contains a chuck on which the table with the protrusions is supported. Unevenness may be the result of differences between the height of the protrusions, or in the backside of the table or in the chuck. Therefore, these elements are carefully made level. Nevertheless, it has been found that unevenness may also result when the chuck and the support table (and any other elements) are assembled or installed.

A further problem with conventional support tables that include protrusions is that the wafer may stick to the protrusions. This compromises the reliability of the wafer handling.

Similar problems may be encountered with support tables for other articles that have to be supported in a well defined plane across the beam path, such as reflective masks or transmission masks.

SUMMARY

It is desirable to address those problems identified with conventional lithographic apparatus. In particular, it is desirable to provide an improved lithographic projection apparatus and a method of operating such an apparatus, in which the problem of unevenness of, and the sticking of the wafer to, the protrusions on a support table is addressed.

According to an aspect of the invention, there is provided a method of adjusting a height of protrusions on a support surface of a support table for holding an article with a planar surface in a predetermined plane transverse to a beam path in a lithographic projection apparatus, the protrusions disposed on the support surface being in an array so as to support the article thereon. The method includes subjecting at least one protrusion to a process of localized surface heat treatment, such that localized areas of an upper surface of the protrusion are melted and subsequently allowed to cool, thereby causing the areas to be raised with respect to the upper surface of the protrusion. In this way, protrusion corrections of up to at least 300 nm may be achieved. Further, the article is less inclined to stick to the upper surface of the protrusion because the total contact area of the article to the protrusion is reduced.

In an embodiment, the protrusions are formed of a homogeneous material. In this way, local raised areas may be formed in the homogeneous material of the protrusion.

In an embodiment, the protrusions are formed of a composite material that includes regions of a first material and regions of a second material. The regions of the second material are provided in a matrix of the first material, and the first material has a higher melting point than the second material. In this way, the characteristics of the protrusion material are exploited to provide a further increase in the amount the height of the protrusion can be adjusted.

In an embodiment, the method includes subjecting the protrusion to the process of localized surface heat treatment, which includes raising the temperature at the surface above the melting temperature of the second material but below the melting temperature of the first material. In this way, the second material forms the raised portion.

In an embodiment, the melted second material is transported to the upper surface of the protrusion by at least one of capillary action and surface tension. In this way, the characteristics of the protrusion material are further exploited to gain yet a further increase in the amount the height of the protrusion can be adjusted.

In an embodiment, the method includes measuring height deviations of respective ones of the protrusions that affect a surface flatness of the planar surface of the article when the surface element is mounted on the chuck, and subjecting the protrusion to the localized surface heat treatment in accordance with the outcome of the measuring. The surface heat treatment corresponds to the detected height deviations of respective ones of the protrusions selectively from the respective ones of the protrusions, while the surface element remains mounted on the chuck. In this way, adjustment can be carried out with feedback.

In an embodiment, the method includes measuring height deviations of protrusions that affect a surface flatness of the planar surface of the article when a surface element is mounted on a chuck, and subjecting the at least one protrusion to the localized surface heat treatment in accordance with the outcome of the measuring, the surface heat treatment corresponding to the measured height deviations, while the surface element remains mounted on the chuck.

In an embodiment, the measuring and surface heat treatment are executed while the support table is in an operable position in the lithographic projection apparatus. In this way, adjustment may be carried out in situ without requiring significant rearrangement.

In an embodiment, the measuring includes: placing an article on the support table, supported by protrusions, measuring a height profile of the planar surface of the article on a side facing away from the protrusions, and computing the height deviations of the protrusions from the height profile.

According to a further aspect of the present invention, there is provided a lithographic projection apparatus. The apparatus includes a beam production system configured to provide a projection beam of radiation, pattern the beam and project the patterned beam onto a target portion of a substrate; and a support table for supporting an article so that a planar surface of the article lies in a predetermined plane transverse to a propagation direction of the projection beam. The support table has a support surface and an array of protrusions disposed on the support surface, so as to support the article on the protrusions. The apparatus also includes a position selective material surface melting device configured to act on individual protrusions when the support table is operable in the apparatus, such that localized areas of an upper surface of the protrusion are melted and subsequently allowed to cool, thereby causing the areas to be raised with respect to the upper surface of the protrusion. In this way, protrusion corrections of up to at least 300 nm may be achieved. Further, the article may be less inclined to stick to the upper surface of the protrusion because the total contact area of the article to the protrusion is reduced.

In an embodiment, the melting device includes a source of a laser and/or an electron beam radiation. In this way, an effective, controllable and versatile melting effect may be achieved.

In an embodiment, the source provides a single wave front. In this way, single areas of the protrusions may be targeted.

In an embodiment, the source provides a single wide wave front incident on the entire surface of at least one of the protrusions. In this way, the entire protrusion may be adjusted at one time.

In an embodiment, the source is configured to provide a narrow scanning beam and/or a dot beam which moves across the upper surface of at least one of the protrusions. In this way, protrusions may be adjusted in a serially scanned manner.

In an embodiment, the source is configured to provide a plurality of narrow beams and/or a plurality of dots. In this way, a plurality of protrusions may be adjusted simultaneously.

In an embodiment, the melting device is configured to provide between approximately 50 to approximately 400 mJ/cm$^2$ to the upper surface of the protrusion. In this way, at least part of the protrusion may be melted without damaging the protrusion.

In an embodiment, the melting device is configured to act independently on individual protrusions when the support table is operable in the apparatus. In this way, the adjustment may be carried out in situ.

In an embodiment, the melting device is configured to provide sufficient energy to melt part of the protrusion material from the individual protrusion. In this way, it is possible to selectively target portions of the protrusion.

In an embodiment, the apparatus includes a control unit coupled between the melting device to control the amount of material melted.

In an embodiment, the melting device includes a source configured to provide a beam of radiation. The control unit is configured to control respective accumulated power doses delivered by the source to the respective ones of the protrusion dependent on the height deviations measured for the respective ones of the protrusions. In this way, the adjustment may be accurately controlled.

In an embodiment, the melting device includes a source configured to provide a beam of radiation. The control unit is configured to control respective accumulated power doses delivered by the source to selected protrusions based on the height deviations measured for the selected protrusions.

In an embodiment, the apparatus includes a computation unit that is configured to compute a height deviation of the protrusions from a predetermined height profile. The control unit controls the melting device by depending on the height deviation. In this way, the accuracy of the adjustment may be further improved.

In an embodiment, the support table and/or the melting device is moveable relative to the other under control of the control unit. This provides a versatile and controlled adjustment.

According to a further aspect of the present invention, there is provided a support table for supporting an article in a lithographic apparatus, so that a planar surface of the article lies in a predetermined plane. The support table includes a support surface and an array of protrusions disposed on the support surface. The protrusions are configured to support the article on an upper surface of the protrusions such that localized areas of an upper surface of at least one protrusion is melted and subsequently allowed to cool, the localized area thus being raised with respect to the upper surface of the protrusion. In this way, protrusion corrections of up to at least 300 nm may be achieved. Further, the article may be less inclined to stick to the upper surface of the protrusion because the total contact area of the article to the protrusion is reduced.

According to a further aspect of the present invention, there is provided a method of adjusting a height of protrusions on a support surface of a support table. The support table has a support surface and an array of protrusions disposed on the support surface, so as to support an article on the protrusions. The method includes subjecting at least one protrusion to a process of localized surface heat treatment, such that localized areas of an upper surface of the protrusion are melted and subsequently allowed to cool, thereby causing the areas to be raised with respect to the upper surface of the protrusion. In this way, support tables with a flatter support surface may be manufactured.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered as synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
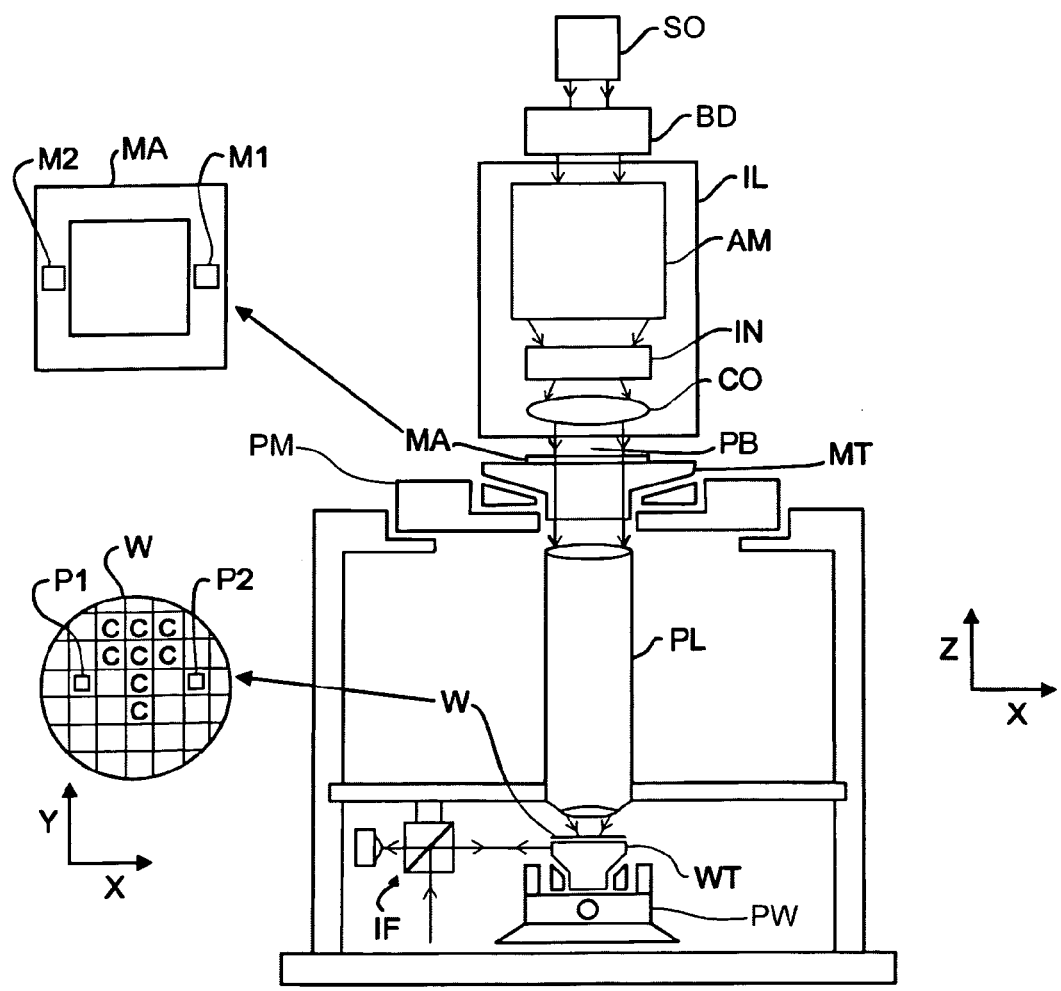
FIG. 1 depicts a lithographic apparatus according to an embodiment of the invention.

FIG. 1 schematically depicts a lithographic apparatus according to a particular embodiment of the invention. The apparatus includes an illumination system (illuminator) IL for providing a projection beam PB of radiation (e.g. UV radiation, DUV, EUV or x ray radiation); a first support structure (e.g. a mask table) MT for supporting a patterning device (e.g. a mask) MA and connected to a first positioner PM for accurately positioning the patterning device with respect to item PL; a substrate table (e.g. a wafer table) WT for holding a substrate (e.g. a resist-coated wafer) W and connected to a second positioner PW for accurately positioning the substrate with respect to item PL; and a projection system (e.g. a refractive projection lens) PL for imaging a pattern imparted to the projection beam PB by a patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system. The illuminator IL may include an adjuster AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
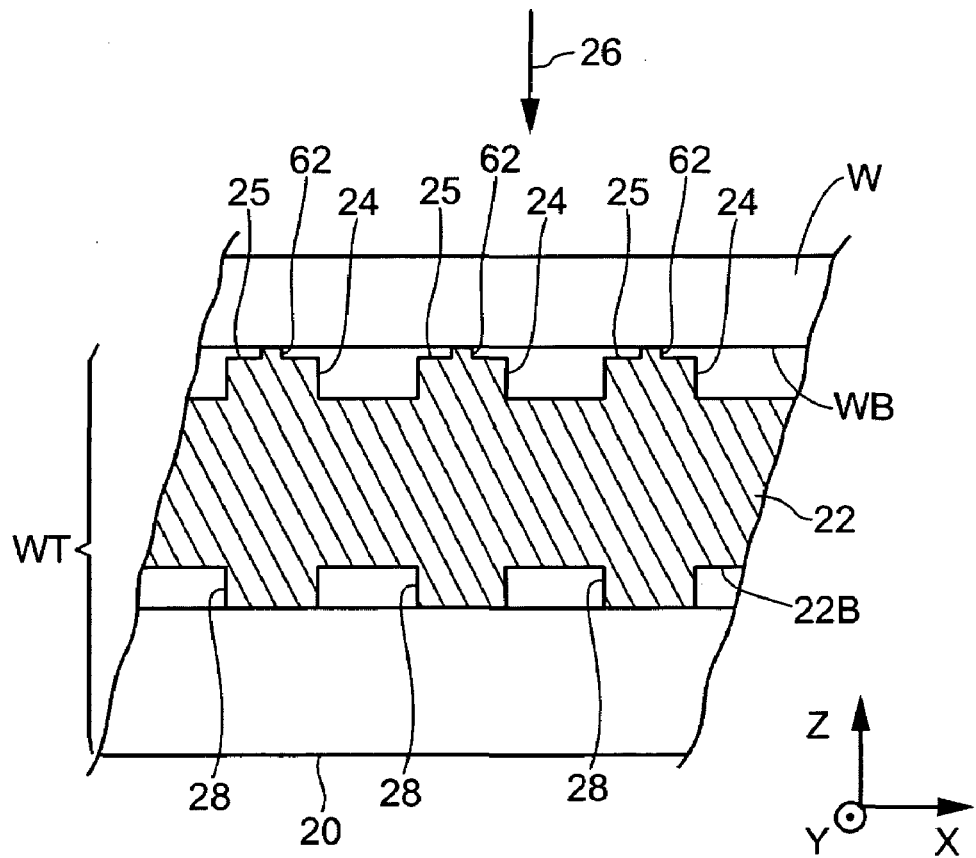
FIG. 2 shows a cross sectional view of a substrate table of the apparatus of FIG. 1.

FIG. 2 shows a cross section of part of the substrate table WT (not to scale). The substrate table WT includes a movable chuck 20, with a table 22 thereon. The propagation direction 26 of projection beam PB is transverse to the surface of table 22. The surface of table 22 is provided with a pattern of protrusions 24 (sometimes called pimples or burls). The tops 25 of protrusions 24 define a support surface. In operation, a substrate W is placed on top of table 22, where the backside WB of the substrate is supported by protrusions 24, so that the backside WB of the substrate follows the support surface. Similarly, the backside 22B of table 22 is provided with further protrusions 28 via which table 22 rests on chuck 20. In accordance with an embodiment of the present invention, the protrusions 24 are subjected to a process of localized surface heat treatment, such that localized areas 62 of an upper surface of the protrusion are melted and subsequently allowed to cool, thereby causing the areas 62 to be raised with respect to the upper surface 25 of the protrusion 24.

The protrusions 24 typically have a size in at least one of the X and Y directions in the order of a millimeter and are provided at mutual distances of the order of several millimeters. Typically, they have a height in the Z direction in the order of 150 micrometers. Typically, both the table 22 and the protrusions 24 may both be made of a ceramic material. In a particular embodiment of the present invention, as described hereinafter with reference to FIGS. 7a and 7b, the protrusions are of a composite material. In particular, the composite material may include two materials, such as silicon and silicon carbide, having differing melting temperatures. The composite material is composed so that the material having the lower melting point is sandwiched between the material having the higher melting point.

However, it should be realized that these dimensions and these materials are merely a suitable example and do not limit the invention.

Figure 3:
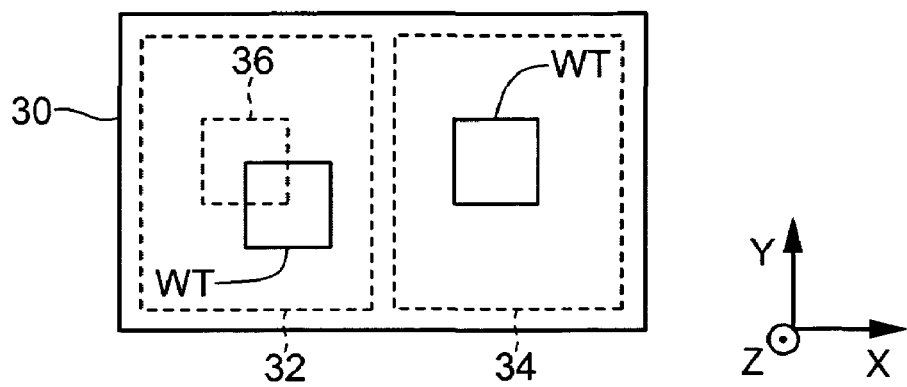
FIG. 3 shows a top view of an illumination table of the apparatus of FIG. 1.

FIG. 3 shows a top view of the illumination table 30 within the photolithographic apparatus, on which the substrate table is located. An illumination area 32 and a preparation area 34 are indicated. In each area 32, 34 a substrate table WT is shown. In operation, the projection beam impinges in a region 36 in the illumination area 32. One table WT with a substrate W on it is illuminated with projection beam PB in illumination area 32 while the other table WT is prepared in preparation area 34. Thus, the tables WT remain with the photolithographic apparatus.

Differences between the heights of the tops of different protrusions 24 induce unevenness of the surface of substrate WT, which may give rise to imaging errors during illumination with the projection beam PB. In modern photolithographic equipment, very small differences between the heights, of the order of tens of nanometers, can already be noticeable. The height differences are due to intrinsic differences between the size of the protrusions 24, further protrusions 28, and the unevenness of chuck 20, but also to the interaction of the various components. Therefore, it has been found that it is desirable to perform a height adjustment step after the substrate table WT has been assembled, i.e., after the table 22 has been placed on the chuck 20.

In an embodiment, adjustments of a size of tens of nanometers or higher of the height of protrusions 24 are made by melting part of the material of selected protrusions 24. According to one aspect of the invention, the adjustment of the height of protrusions 24 is performed in the photolithographic apparatus, on the illumination table 30, where the substrate tables WT are also located during normal operation.

Figure 4:
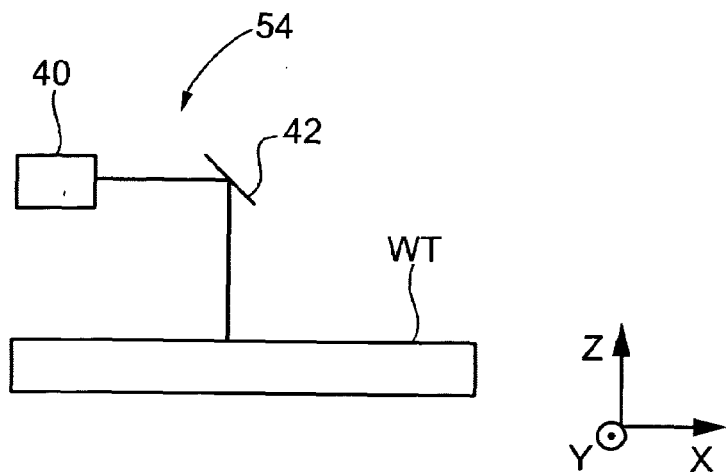
FIG. 4 shows an embodiment of a material melting device of the apparatus of FIG. 1.

FIG. 4 shows an embodiment of a material melting (or removing) device 54. The figure shows substrate table WT in side view (no protrusions are shown, because the protrusions are too small to be visible at the scale of the figure). The material removing device 54 contains a laser 40 and a mirror 42. The mirror 42 is used to direct the beam of the laser 40 to the surface of the table WT. By rotating the mirror 42 and/or moving the substrate table WT, the beam of the laser 40 can be directed to the locations of different protrusions on the substrate table WT. The beam is used to melt material in the protrusions, e.g. by heating the top of the protrusion so that part of the material of which the protrusion is made melts. The beam is focused, or is otherwise of such narrow width or suitable dot size that when the intensity of the beam is high enough to melt material from a single protrusion at which the beam is directed, the beam intensity at other protrusions is then so low that substantially no material is melted in those other protrusions, for example, because the intensity is insufficient to melt material from any other protrusion. With further reference to FIGS. 5a and 5b, it is seen that causing material of the protrusion to melt increases the height of the protrusion. It has been found that the surface tension of the melted material causes the melted material to migrate from the bulk of the protrusion to form a region of raised height, in other words a bulge, on the surface of the protrusion to thereby locally increase the height of the protrusion. In an embodiment, the composite material includes at least two materials with different melting points arranged so that when subject to appropriate heating, the melted material migrates due to at least one of capillary action formed in the composite material and surface tension. The location of the increase in height of the protrusion is dependent on factors such as the heating target, which is determined by the melting device 54 shown in FIG. 4. The location of the increase in height of the protrusion is further determined by the structure of the composite and the relative dimensions of the composite components. Typically, the bulge is located on the region of the composite material having a lower melting point which has been exposed to sufficient heating from the melting device. It has been found that the surface tension of the melted material prevents the material from flowing out over the surface of the protrusion. Once the heating is stopped, the melted material solidifies to form a solid height increase at the location.

Typically, the laser 40 is operated in pulsed fashion, and irradiates a particular protrusion with a number of "shots" in proportion to the height increase that has been determined for the protrusion. Of course, instead of the mirror 42, other ways of changing the location where the laser beam hits the substrate table WT may be used, such as moving substrate table WT or the laser 40 itself.

Figure 5:
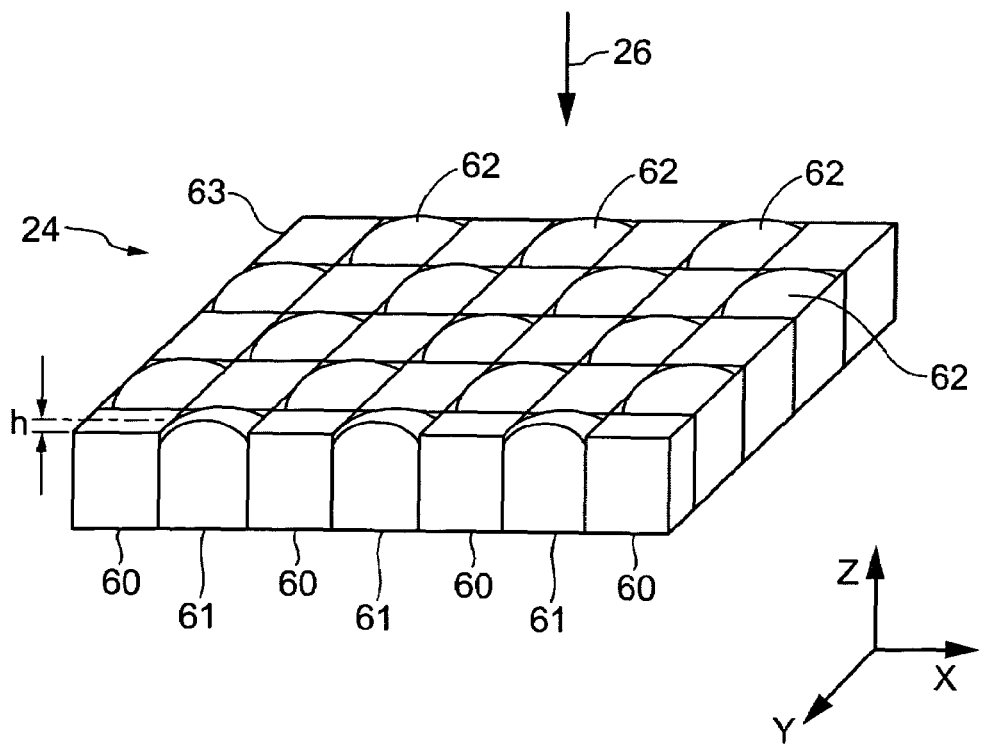
FIG. 5 shows a protrusion according to an embodiment of the present invention.

FIG. 5 shows a protrusion according to an embodiment of the present invention. In particular, FIG. 5 shows a protrusion in three dimensions, as it is disposed on the table 22. The protrusion 24 is made of a composite material. The composite material includes regions 60 of a first material and regions 61 of a second material. The melting point of the second material is lower than the melting point of the first material. The regions of the first and second material are arranged so that when the second material is melted by the melting device 54 it is contained by the first material except at a surface of the protrusion 24 arranged to receive the heat of the melting device 54, whereat the melted material forms a localized height increase in the Z direction on the surface 63 having a height h. The height increase appears as a bulge on the surface of the protrusion. In FIG. 5, the heat is provided in the form of a radiation beam 26. For example, the composite material may include a sandwich structure, wherein the second material 61 is sandwiched between layers of the first material 60. In FIG. 5, a sandwich structure is shown that includes elements of the first material 60 that extend substantially along the Y direction having a height of approximately 150 micrometers in the Z direction and a width in the X direction of approximately 100–500 micrometers. Sandwiched between two adjacent elements of the first material 60 is an element of the second material 61 having a structure similar to that of the elements of the second material 61. In one embodiment, the width of the element of the second direction may be less than that of the elements of the first material. In an alternative embodiment, the elements may extend in a longitudinal direction in the X direction. It will be understood that the present embodiment is not limited to the structure shown in FIG. 5. Alternative structures are envisaged which fall within the scope of the present invention. For example, the protrusion 24 may include regions of the second material 61 surrounded by regions of the first material 60.

The first material 60 may be silicon carbide having a melting point of 2830 degrees Celsius. The second material 61 may be silicon having a melting point of 1412 degrees Celsius. The table 22 may include other materials, including but not limited to quartz, ZERODUR®, and cordierite. Further, the table 22 may include a titanium nitride coating.

The melting device 54 as shown in FIG. 4 is arranged to heat the surface or the part of the surface of a particular protrusion, protrusions or an area of a protrusion, or protrusions. At those regions where material is melted a localized increase in the height h of the protrusion is achieved. The height h of the protrusion is determined by factors such as the number of pulses, the wavelength of the radiation, and is discussed in more detail with reference to FIGS. 6 to 8. For example, using a YAG-laser having a range of wavelengths between 266 and 1064 nanometers, it has been found that a thin layer of silicon is melted at the surface of the protrusion 24. A laser source has been found to be particularly suited since it causes effective surface heating of the protrusion without causing significant heating of the bulk of the protrusion 24, which might cause unwanted thermal effects. Therefore, the heating effect is highly controllable and localized.

A YAG-laser is found to be particularly suitable since it is highly tunable. Alternatively, for a composite SiSiC structure, the heat source may include an excimer laser having a wavelength of 193 nm. A further advantage of a laser source is that laser sources are typically provided within a lithographic apparatus. Therefore, the melting device 54 may be arranged to incorporate an existing laser within the lithographic apparatus. For example, a laser provided to clean the substrate table in the lithographic apparatus may also be incorporated into the melting device 54. However, the invention is not limited in this respect and may include any heater suitable to melt at least a region of a protrusion 24. Suitable energy beams include electron beams.

As mentioned, due to the surface tension of the melted second material, for example, silicon, the silicon migrates and bulges out, thus locally increasing the height of the protrusion. It has been found that spot corrections of up to at least 300 nanometers are achievable. It has further been found that by locally increasing the height of the protrusions at certain locations, wafer sticking is reduced. It has been found that locally formed bulges, in particularly those formed of silicon, on the surface of the protrusion are elastically deformable. Further, the provision of bulges on the protrusion 24 decreases the total contact area of the wafer with the table 22. It has been found that at least one of these factors contributes to a reduced sticking effect of the wafer to the table 22, thus improving the ease with which wafers may be handled within the lithographic apparatus. Once the heating is terminated, the melted material solidifies to form a localized solid region having a height which is increased with respect to the upper surface of the protrusion. Once the melted material has solidified, the wafer or reticle may be disposed on the support table, which may be, for example, the wafer or reticle (or mask) table.

It has further been found that the wavelength of the laser radiation has a significant influence on the temperature at the surface of the protrusion 24 on which the radiation is incident. It has been found that for a wavelength of 266 nm, the height of the protrusion may be increased beyond a threshold of approximately 50–100 mJ/cm$^2$. For a wavelength of 355 nm, the height of the protrusion may be increased beyond a threshold of approximately, 100 mJ/cm$^2$. For a wavelength of 532 nm, the height of the protrusion may be increased beyond a threshold of approximately 100–200 mJ/cm$^2$. For a wavelength of 1064 nm, the height of the protrusion may be increased beyond a threshold of approximately 400 mJ/cm$^2$.

Figure 6A:
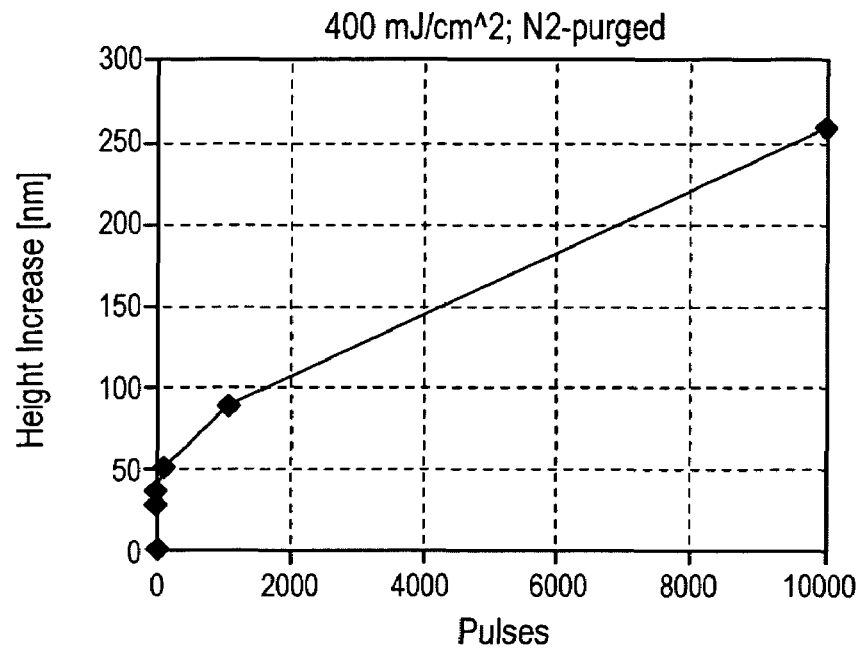
FIGS. 6a and 6b are graphs relating the protrusion growth with respect to the number of pulses of radiation of duration 8 nanoseconds at a wavelength of 355 nanometers.
Figure 6B:
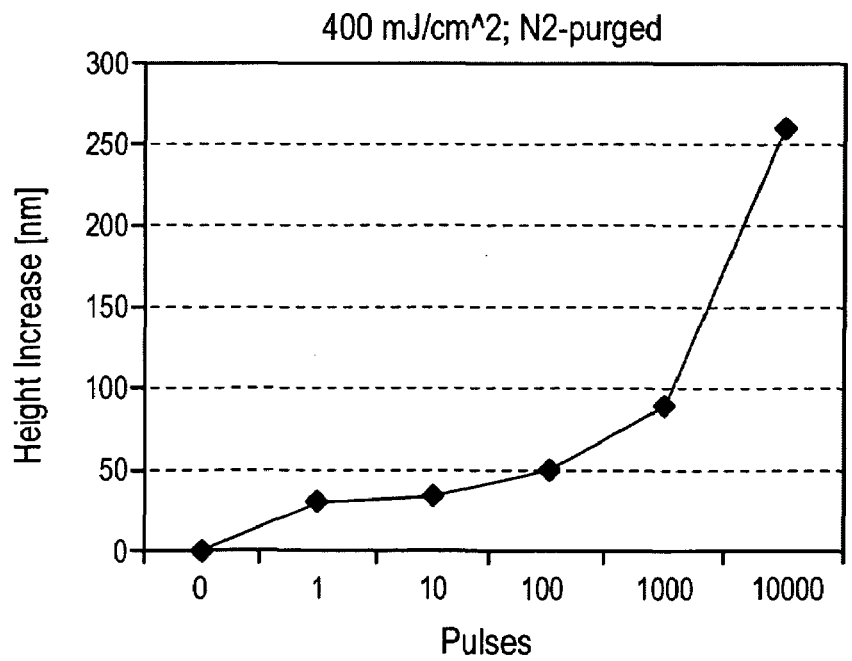

FIGS. 6a and 6b are graphs relating the protrusion growth with respect to the number of pulses of radiation of duration 8 nanoseconds at a wavelength of 355 nanometers. It has been found that if the protrusion (burl) is exposed to multiple shots (also referred to as pulses), the height of the protrusion in the Z direction increases, resulting in a hot spot on a wafermap. The wafer mapping procedure that is carried out in order to determine the wafermap is described hereinbelow in detail with reference to FIG. 10. With reference to FIGS. 6a and 6b, the increase in the height of the protrusion (in nanometers) is plotted against the number of pulses of radiation. In the example shown in FIGS. 6a and 6b, the wavelength of the pulses was 355 nm and the duration was 8 ns. The energy per unit area of the radiation pulses was 400 mJ/cm$^2$. The procedure was carried out on the protrusion in a nitrogen purged atmosphere in a lithographic apparatus. The results obtained and shown in FIGS. 6a and 6b are also given in Table 1 below. As previously mentioned, the procedure for mapping the wafer to obtain the results shown in FIGS. 6a and 6b and in Table 1 is described with reference to FIG. 10.

TABLE 1

| number of pulses | height of increase (nm) |
|---|---|
| 0 | 0 |
| 1 | 30 |
| 10 | 35 |
| 100 | 50 |
| 1000 | 90 |
| 10000 | 260 |

By exposing the protrusion to a heat source as described, it has been found that the height of the protrusion is accurately controlled. Further, it has been found that the growth rate reduces as the number of pulses increases. Further, it has been found that the growth rate may be influenced by the purging environment in the lithographic apparatus. For example, it has been found that a height increase of 500–600 nm may be achieved in an air purged environment with respect to a height increase of 150–260 nm in a nitrogen or argon purged apparatus.

Further, it has been found that the quality of the purging environment also affects the increase in height of the protrusion when subject to a certain radiation dose. For example, purging with a jet reduces less, as compared to purging with a purge hood. It has further been found that the growth rate of the protrusion may also be influenced by the energy per pulse. For example, the hot spot growth is approximately 150–260 nm for 10000 pulses at 400 mJ/cm$^2$. The region of increased height is about 60 nm for 10000 pulses at 200 mJ/cm$^2$. Further, some growth is found to occur from around approximately 100 mJ/cm$^2$ for 10000 pulses. It is noted that such an exposure is lower than that required for the cleaning of at least some contamination of the table using a laser source. Thus, it is possible to increase the height of the protrusion independently of cleaning the table. It has further been found that when air is used for cleaning the table, due to cycling, the height increased may be slightly reduced. However, after an initial reduction in the increase in the height of the protrusion, the height remains stable during continued processing and cleaning. In an embodiment, a height increase may be removed with a mechanical cleaning tool. Again, shooting, for example, 10000 shots on the protrusion gives globally on the same growth. It has further been found that with a shooting frequency of 1 to 15 Hz, the growth is not significantly influenced.

Figure 7A:
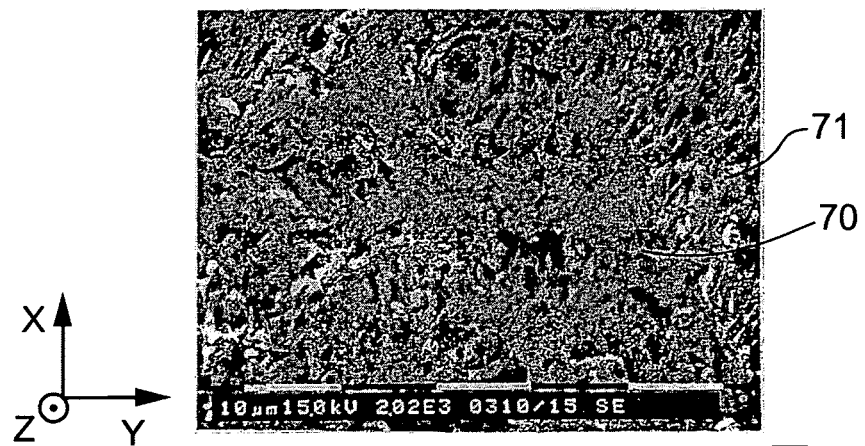
FIGS. 7a, 7b and 7c show protrusions exposed to varying degrees of radiation at 355 nanometers.
Figure 7B:
Figure 7C:

FIGS. 7a, 7b and 7c show plan views taken from above of protrusions exposed to varying degrees of radiation at 355 nanometers. In particular, FIGS. 7a, b and c show a 2020× scanning electron microscope image of an area of an upper surface of the protrusion on which the heating radiation is incident. In FIGS. 7a,b and c, the protrusion is of a SiSiC composite material. Material analysis, such as Edax was carried out. In FIGS. 7a, b and c, the lighter grey areas 70 have been analyzed and found to include silicon, whereas the mottled areas 71 have been analyzed and found to include SiC. In the analysis, no further elements were found to be present. In particular, FIG. 7a shows a protrusion which has not yet been subject to heating in accordance with the present invention. FIG. 7b shows a protrusion which has been subject to one pulse of radiation of 400 mJ/cm² of 355 nm radiation in a nitrogen purged atmosphere in a lithographic apparatus. FIG. 7c shows a protrusion which has been subject to 10000 pulses of radiation of 400 mJ/cm² of 355 nm radiation in a nitrogen purged atmosphere in a lithographic apparatus.

Figure 8A:
FIGS. 8a and 8b show a protrusion according to an embodiment of the present invention, and a conventional protrusion, respectively.
Figure 8B:
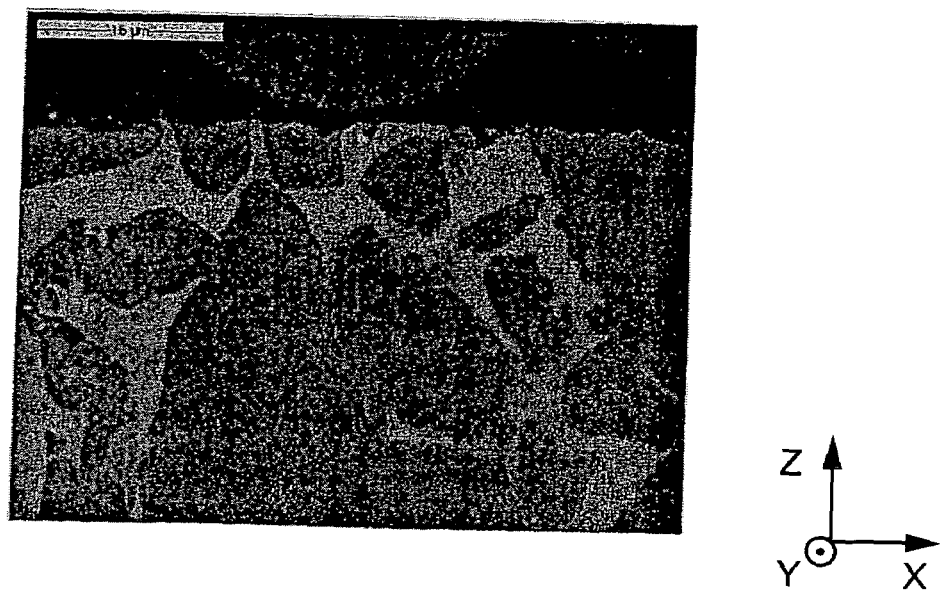

FIGS. 8a and 8b show a protrusion according to an embodiment of the present invention, and a conventional protrusion, respectively. In particular, FIGS. 8a and 8b show a cross section of the protrusion in the X-Z plane. FIG. 8a shows a protrusion according to an embodiment of the present invention, wherein the height of the protrusion is locally increased by a height h. In FIG. 8a, the height increase h was achieved using 10000 pulses of radiation of 400 mJ/cm² of 355 nm radiation in a nitrogen purged atmosphere in a lithographic apparatus. It can be seen that two areas A, B of local height increase are observed. These regions A, B of localized height increase, which may also be referred to herein as hotspots or miniburls, serve as a support surface for the wafer W. By contrast, FIG. 8b shows a protrusion which has not been subject to the heating device of the present invention.

Figure 9:
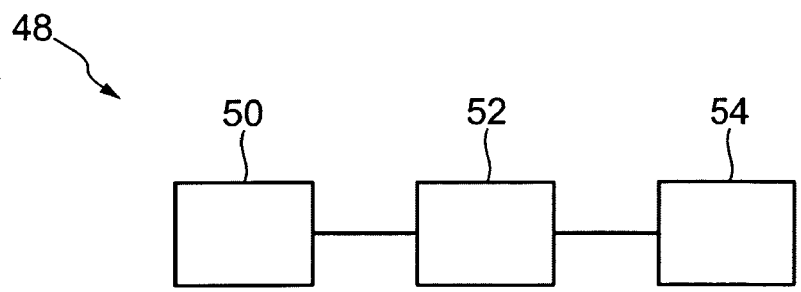
FIG. 9 shows a control sub-system of the lithographic apparatus of FIG. 1.

FIG. 9 shows a control sub-system 48 of a lithographic apparatus. The control subsystem contains a measuring device 50 coupled to a processor 52, which in turn is coupled to the material removing device 54.

Figure 10:
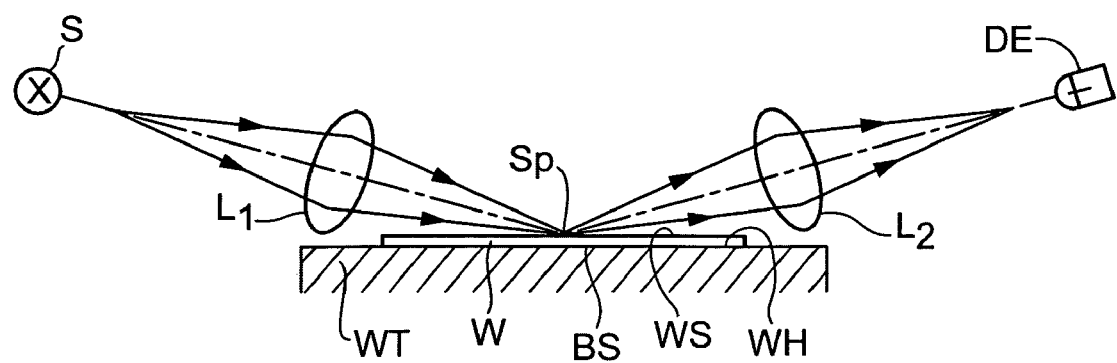
FIG. 10 shows a measuring device of the lithographic apparatus of FIG. 1.

FIG. 10 shows a measuring device for measuring a protrusion according to an embodiment of the present invention. This measuring device is a conventional device used for determining unevenness of a substrate W prior to illumination of that substrate with projection beam PB, in order to control focusing corrections during illumination of the substrate. Therefore, the measuring device will not be described in detail. In particular, the measuring device determines the evenness of the wafer, in particular, the height profile of the wafer across the surface of the wafer. The device measures the level of a substrate W located with its backside BS on substrate table WT. A source of radiation S produces a spot SP on the surface of substrate W from where the radiation is reflected to detector DE, which is constructed to measure changes in height of the reflected radiation when spot SP and substrate W are moved relative to one another. Preferably, the measuring device is also used during normal operation of the apparatus to determine unevenness of a substrate W prior to illumination of the substrate to control focusing corrections during illumination. Of course, different kinds of measuring devices may be used, such as mechanical or pneumatic sensors.

In operation, when a new substrate table WT has been installed in the lithographic apparatus, the processor 52 is made to execute a program for adjusting the heights of the protrusions. This program may optionally be executed later to correct for wear. When the program is executed, a reference substrate of high flatness is first placed on substrate table WT. Preferably, the protrusions are cleaned before the substrate is placed on the protrusions, to remove any contaminant material from the protrusions. This may be done in any known way.

The program causes processor 52 to obtain as series of measurement results from measuring apparatus 50 that are characteristic of the height profile h(r) of the reference substrate on the substrate table WT. The processor 52 stores the results of these measurements. This process may be repeated a number of times with the reference substrate located at different positions on the substrate table WT, and/or with different reference substrates. Should it be desired to provide height increases in accordance with the present invention, by providing height increases at certain locations, a desired profile is selected or entered. Subsequently, the processor 52 causes the melting device to provide such a selected or entered profile on the relevant protrusions.

Next, the processor 52 computes whether and which protrusions 24 have a height deviation from the selected or entered profile, and preferably also the size of the deviation from the profile. Typically, this is done by deriving for each particular protrusion a height value of the height profile h(r) in a respective regions of locations "r" on the surface of the reference substrate that overlies the particular protrusion. The height value can be determined in any way. In one embodiment, for example, the deviation is determined by sampling the height profile h(r) at a predetermined position $r=r_p$ relative to the protrusion (preferably directly over the protrusion). In another embodiment, the excess is determined by integrating (or summing) the measured height profile h(r) of the substrate over a predetermined region that overlies the protrusion, and no other protrusions, optionally weighting the height profile h(r) with a weight function $w_p(r)$.

From the height values for the protrusions, the processor 52 determines the lowest value, i.e. the height value of the protrusion over which the exposed surface of the substrate is closest to the support table. The difference between the height value for a particular protrusion and this lowest value is called the excess height of the profile for the particular protrusion.

Preferably, the height profiles h(r) from a number of different measurements are combined, the different profiles having been measured with the reference substrate at different positions, or with different substrates, so as to reduce or eliminate effects due to unevenness of the substrate. For example, the processor 52 may determine a height deviation from the average $h_{av}$ of different profiles $h_i(r)$ (i=1, 2 . . . ) obtained in this way.

From the computed height deviations of the profile for the particular protrusions, the processor 52 computes the height deviation of the underlying protrusion 24. Preferably, an empirically determined relation is used for this purpose, for example, a relation determined by measuring the height of the substrate repeatedly, each time after melting a given amount of material in a test protrusion, or after firing a given a number of laser shots at the protrusion 24. The empirical relation may be represented, for example, by a table that associates a computed value of amount of material melted or a number of laser shots for a particular laser source and protrusion composition. A further table may be provided that associates the number of pulses to the height increase at a location for a particular source. Instead of a table, a polynomial function may be used, for example, with empirically determined coefficients.

Subsequently, the reference substrate is removed, so that the protrusions 24 are exposed. The processor 52 now controls the material melting device 54 to aim at a series of protrusions 24 successively, for which a height deviation has been detected. When the material melting device 54 is aimed at such a protrusion 24, the processor 52 controls the material melting device 54 to fire the number of shots that is expected to melt the protrusion so that the deviation is corrected by increasing the height of the protrusion. The power level of the laser 40 during firing of the shots is set to a level that is sufficient to melt material of the protrusion.

When the height deviation has been computed directly in terms of the number of shots required, providing a particular height increase is straightforward. Otherwise, an empirical relation between the number of shots and the amount of height change may be used to determine the number of shots. Instead of using a series of shots a continuous pulse may be used, the processor 52 selecting the duration and/or the intensity of the pulse according to the height deviation of the protrusion, for example, according to a table that relates height increase of protrusions to the duration and/or intensity. Similarly, a combination of pulses with different durations and/or intensities may be used. In an embodiment, height deviations of respective ones of the protrusions are measured that affect a surface flatness of the planar surface of the article when the surface element is mounted on the chuck. The protrusion is subjected to the localized surface heat treatment in accordance with the outcome of the measuring, the surface heat treatment corresponding to the detected height deviations of respective ones of the protrusions selectively from the respective ones of the protrusions, while the surface element remains mounted on the chuck. In this way, adjustment can be carried out with feedback. In situ height increases may be carried out, for example, by choosing a wavelength, such as 1064 nm, with respect to which the a silicon wafer is transparent, so that the radiation is absorbed by the wafer table. Alternatively, a transparent wafer may be provided, for example, a quartz wafer. In such a case, a broader range of wavelengths may be used for heating the wafer table surface. While height adjustments are being carried out in situ, the clamping force may be reduced. This may be achieved by temporarily reducing a vacuum force applied to the wafer.

It should be appreciated that the invention is not limited to the use of a laser as the material melting device, although a laser may be especially advantageous because it can conveniently be combined with a lithographic apparatus. Alternative material melting devices include surface heating devices. Should it be determined that an excess height on a protrusion exists, it may be removed by a polishing machine, with a sufficiently small polishing head that can be positioned relative to the wafer table so that at each position, an individual protrusion may be polished to remove material from that protrusion, substantially without affecting the height other protrusions. In this case the force with which the polishing head is pressed against the protrusion is set to a level that makes it possible to remove material of the protrusion. The force and/or polishing duration are set according to the excess height that has been determined for the protrusion. As an alternative to the use of a laser, any other material removing technique that can be directed at individual protrusions may be used, e.g. abrasion by an electron beam.

It is not even necessary that material be melted in protrusions individually, as long as the amount of material melted from respective protrusions can be controlled independently. For example, if the melting device can be set to different gradients, melting material from more than one protrusion at a time, but with a gradient in the melted amount as a function of position of the protrusion, different successive gradient settings may be used to control the removed amount of different protrusions independently of one another.

Although the invention has been described in terms of removal of material, it should be appreciated that, without deviating from the invention, the height of the protrusions can also be adjusted by depositing material onto selected protrusions. Any known localized depositing technique, such as sputtering, with a source moved close to the protrusion, may be used. In this case, an abduction unit or a getter shield is preferably provided in the vicinity of the protrusion to capture excess material that is not deposited on the protrusion. Of course, any combination of a material removing device and a material adding device may be used.

In the case that material is added, the protrusion with the lowest height value need not be used as reference to determine excess height values. Instead, the highest height value should be used if only adding of material is possible, to determine the amount of deposition needed to bring the other protrusions level with the protrusion with the highest height value. When both adding and removing is possible, any reference height may be used to draw the protrusions level with. This height may be selected so that only a predetermined small fraction of the protrusions requires added material, for example.

It should also be understood that, instead of the described way of computing the height deviations of the protrusions, other methods of determining the height deviations of protrusions may be used. For example, the height profile may be fitted to a model for the height profile, in which the heights of the protrusions are free parameters that are fitted so as to best approximate the measured profile (an example of a model is that the height profile is the sum $h(r)=\Sigma h_i b(r+r_i)$ where the sum is over the protrusions, labeled "i", $h_i$ is the height of protrusion i and $b(r)$ is the height profile for a protrusion of unit height, which may be determined experimentally or theoretically). Other related statistical estimation techniques may be used as well. Similarly, ways of using the height profiles for the same substrate at different positions that do not merely involve averaging may be used, for example, by fitting a model $\Sigma h_i \{b(r+r_i)-b(r+d+r_i)\}$ to a measured difference $h_1(r)-h_2(r+d)$ of two profiles obtained for the same reference substrate, with a measured profile $h_1(r)$ at a first position and a second measured profile $h_2(r)$ when the reference substrate has been displaced with respect to the substrate table over an offset "d" with respect to the first position.

Furthermore, it should be realized that, although the invention has been described in terms of height measurements using a substrate located on the substrate table WT, the processor 52 may also used height measurements obtained from the protrusions directly, when the protrusions are uncovered. The advantage of measuring on a substrate is that use can be made of equipment that is already available in the lithographic apparatus for use in normal operation.

Furthermore, it should be realized that, although a single processor 52 has been shown by way of example, the necessary computations and control operation may of course be executed by several processors. Similarly, although measurement and adjustment have been described as consecutive operations, the adjustment may of course be postponed for an arbitrary time after the measurement, allowing other operations to be performed in between.

Also, although the invention has been described for a transmissive type apparatus, it should be realized that the invention may also be applied to an apparatus that reflects the beam using a mask. Furthermore, although the invention has been described for a substrate table, it should be realized that the invention may be applied to a support table for another article in the lithographic projection apparatus, such as a table for supporting a mask or a reticle. Furthermore, although the invention has been described for protrusions that are made of a composite material, it should be realized that the invention may be applied to protrusions made of entirely one material, or for example, to protrusions which are provided with a coating layer at least at the top of each protrusion, attached to the underlying part of the protrusion.

While specific embodiments of the invention have been described above, it will be appreciated that the invention may be practiced otherwise than as described. The description is not intended to limit the invention.

What is claimed is:

1. A method of adjusting a height of protrusions on a support surface of a support table for holding an article with a planar surface in a predetermined plane transverse to a beam path in a lithographic projection apparatus, the protrusions disposed on the support surface being in an array so as to support the article thereon, the method comprising subjecting at least one protrusion to a process of localized surface heat treatment, such that localized areas of an upper surface of the protrusion are melted and subsequently allowed to cool, thereby causing the localized areas to be raised with respect to the upper surface of the protrusion.

2. A method according to claim 1, wherein the protrusions are formed of a homogeneous material.

3. A method according to claim 1, wherein the protrusions are formed of a composite material comprising regions of a first material and regions of a second material, wherein the regions of the second material are provided in a matrix of the first material, and wherein the first material has a higher melting point than the second material.

4. A method according to claim 3, wherein said subjecting the protrusion to the process of localized surface heat treatment comprises raising the temperature at the surface above the melting temperature of the second material, but below the melting temperature of the first material.

5. A method according to claim 4, wherein the melted second material is transported to the upper surface of the protrusion by capillary action and/or surface tension.

6. A method according to claim 1, further comprising measuring height deviations of protrusions that affect a surface flatness of the planar surface of the article when a surface element is mounted on a chuck, and subjecting the at least one protrusion to the localized surface heat treatment in accordance with the outcome of the measuring, the surface heat treatment corresponding to the measured height deviations, while the surface element remains mounted on the chuck.

7. A method according to claim 6, wherein the measuring and the surface heat treatment are executed while the support table is in an operable position in the lithographic projection apparatus.

8. A method according to claim 6, wherein said measuring comprises placing an article on the support table, such that the article is supported by the array of protrusions, measuring a height profile of a planar surface of the article on a side facing away from the protrusions, and computing the height deviations of the protrusions from the height profile.

9. A method according to claim 1, wherein the support table is made of a non-composite material.

10. A method according to claim 1, further comprising illuminating at least one protrusion with a matrix of dark and light fields which extend over the upper surface of the protrusion.

11. A lithographic projection apparatus comprising:
a beam production system configured to provide a beam of radiation, pattern the beam, and project the patterned beam onto a target portion of a substrate;
a support table for supporting an article so that a planar surface of the article lies in a predetermined plane transverse to a propagation direction of the projection beam, the support table having a support surface and an array of protrusions disposed on the support surface that are constructed and arranged to support the article; and
a position selective material surface melting device configured to act on individual protrusions when the support table is operable in the apparatus, such that localized areas of an upper surface of the protrusion are melted and subsequently allowed to cool, thereby causing the localized areas to be raised with respect to the upper surface of the protrusion.

12. An apparatus according to claim 11, wherein the melting device comprises a source of a laser and/or electron beam radiation.

13. An apparatus according to claim 12, wherein the source provides a single wave front.

14. An apparatus according to claim 12, wherein the source provides a single wide wave front incident on the entire surface of at least one of the protrusions.

15. An apparatus according to claim 12, wherein the source is configured to provide a narrow scanning beam and/or a dot beam that moves across the upper surface of at least one of the protrusions.

16. An apparatus according to claim 12, wherein the source is configured to provide a plurality of narrow beams and/or a plurality of dots.

17. An apparatus according to claim 11, wherein the melting device is configured to provide between approximately 50 to approximately 400 mJ/cm$^2$ to the upper surface of the protrusion.

18. An apparatus according to claim 11, wherein the melting device is configured to act independently on individual protrusions when the support table is operable in the apparatus.

19. An apparatus according to claim 11, wherein the melting device is configured to provide sufficient energy to melt part of the protrusion material from the individual protrusion.

20. A lithographic projection apparatus according to claim 11, wherein the article is the substrate.

21. A lithographic projection apparatus according to claim 11, wherein the article is a reticle or mask that is used to pattern the beam.

22. An apparatus according to claim 11, further comprising a control unit coupled to the melting device to control the amount of material melted.

23. An apparatus according to claim 22, wherein the melting device comprises a source configured to provide a beam of radiation, wherein the control unit is configured to control respective accumulated power doses delivered by the source to selected protrusions based on the height deviations measured for the selected protrusions.

24. An apparatus according to claim 22, further comprising a computation unit configured to compute a height deviation of the protrusions from a predetermined height profile, the control unit controlling the melting device based on the height deviation.

25. An apparatus according to claim 22, wherein the support table and/or the melting device is moveable relative to the other under control of the control unit.

26. A support table for supporting an article in a lithographic apparatus so that a planar surface of the article lies in a predetermined plane, the support table comprising a support surface and an array of protrusions disposed on the support surface, the protrusions being configured to support the article with an upper surface, wherein localized areas of the upper surface of at least one protrusion is melted and subsequently allowed to cool, the localized areas thus being raised with respect to the upper surface of the protrusion.

27. A method of adjusting a height of protrusions on a support surface of a support table, the support table having a support surface and an array of protrusions disposed on the support surface that are constructed and arranged to support an article, the method comprising subjecting at least one protrusion to a process of localized surface heat treatment such that localized areas of an upper surface of the protrusion are melted and subsequently allowed to cool, thereby causing the localized areas to be raised with respect to the upper surface of the protrusion.

* * * * *